(12) United States Patent
Wada

(10) Patent No.: US 11,776,616 B2
(45) Date of Patent: Oct. 3, 2023

(54) DRAM MEMORY DEVICE WITH OXIDE SEMICONDUCTOR ACCESS TRANSISTOR AND METHOD OF CONTROLLING PLATE LINE POTENTIAL

(71) Applicant: Kioxia Corporation, Tokyo (JP)

(72) Inventor: Masaharu Wada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 77 days.

(21) Appl. No.: 17/472,172

(22) Filed: Sep. 10, 2021

(65) Prior Publication Data

US 2022/0310153 A1    Sep. 29, 2022

(30) Foreign Application Priority Data

Mar. 24, 2021  (JP) ................................. 2021-050690

(51) Int. Cl.
G11C 5/14 (2006.01)
G11C 11/4091 (2006.01)
G11C 11/4094 (2006.01)
G11C 11/22 (2006.01)
G11C 11/4074 (2006.01)

(52) U.S. Cl.
CPC ...... *G11C 11/4091* (2013.01); *G11C 11/4094* (2013.01); *G11C 5/14* (2013.01); *G11C 11/2273* (2013.01); *G11C 11/4074* (2013.01)

(58) Field of Classification Search
CPC ... G11C 11/4091; G11C 11/4094; G11C 5/14; G11C 11/2273; G11C 11/4074; G11C 16/0466

See application file for complete search history.

(56) References Cited

U.S. PATENT DOCUMENTS

| 6,094,370 | A | * | 7/2000 | Takashima | ............. | H10B 53/00 |
| | | | | | | 257/E27.104 |
| 9,093,175 | B2 | | 7/2015 | Barth, Jr. et al. | | |
| 9,202,531 | B2 | | 12/2015 | Seo | | |
| 2003/0076117 | A1 | * | 4/2003 | Igarashi | .................. | G11C 11/22 |
| | | | | | | 324/658 |
| 2003/0076704 | A1 | * | 4/2003 | Ashikaga | ................ | G11C 11/22 |
| | | | | | | 365/145 |
| 2005/0041514 | A1 | * | 2/2005 | Fujino | ................. | G11C 11/4094 |
| | | | | | | 365/230.08 |
| 2005/0270880 | A1 | * | 12/2005 | Hsu | ...................... | G11C 11/4074 |
| | | | | | | 365/226 |
| 2008/0094921 | A1 | * | 4/2008 | Iida | ..................... | G11C 11/4094 |
| | | | | | | 365/189.09 |
| 2020/0312385 | A1 | | 10/2020 | Oak | | |
| 2022/0069131 | A1 | * | 3/2022 | Pesic | ....................... | H01G 4/005 |
| 2022/0108985 | A1 | * | 4/2022 | Nagatsuka | .......... | H01L 27/1251 |

* cited by examiner

*Primary Examiner* — Mushfique Siddique
(74) *Attorney, Agent, or Firm* — Foley & Lardner LLP

(57) ABSTRACT

A semiconductor memory device includes a memory cell that includes a capacitor including a first and second end and a first transistor. The first transistor includes a third and fourth end, is coupled to the first end at the fourth end, and contains an oxide semiconductor. A bit line is coupled to the third end. A sense amplifier is coupled to the bit line and coupled between a first node of a first potential and a second node of a second potential lower than the first potential. A potential generator is configured to supply the second end with a fourth potential that is different from a third potential intermediate between the first potential and the second potential.

13 Claims, 13 Drawing Sheets

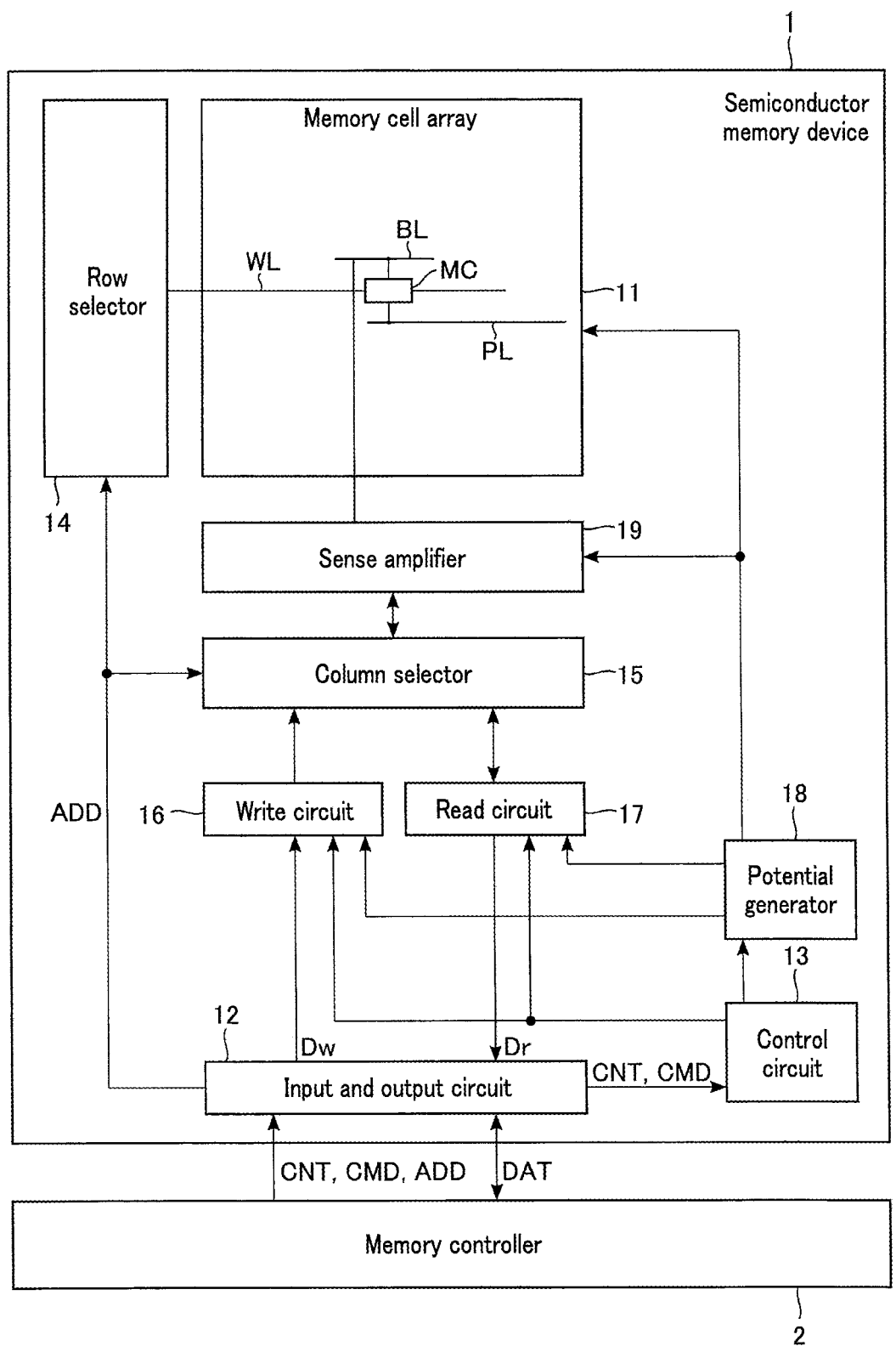
F I G. 1

Silicon transistor
Oxide semiconductor transistor
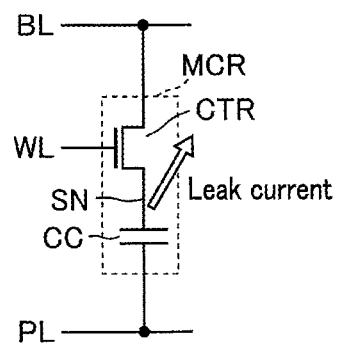
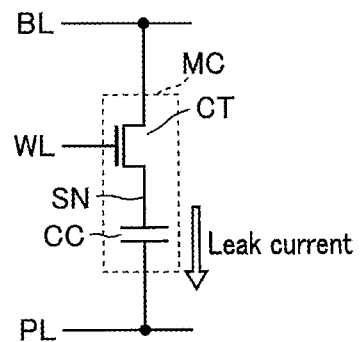
F I G. 3

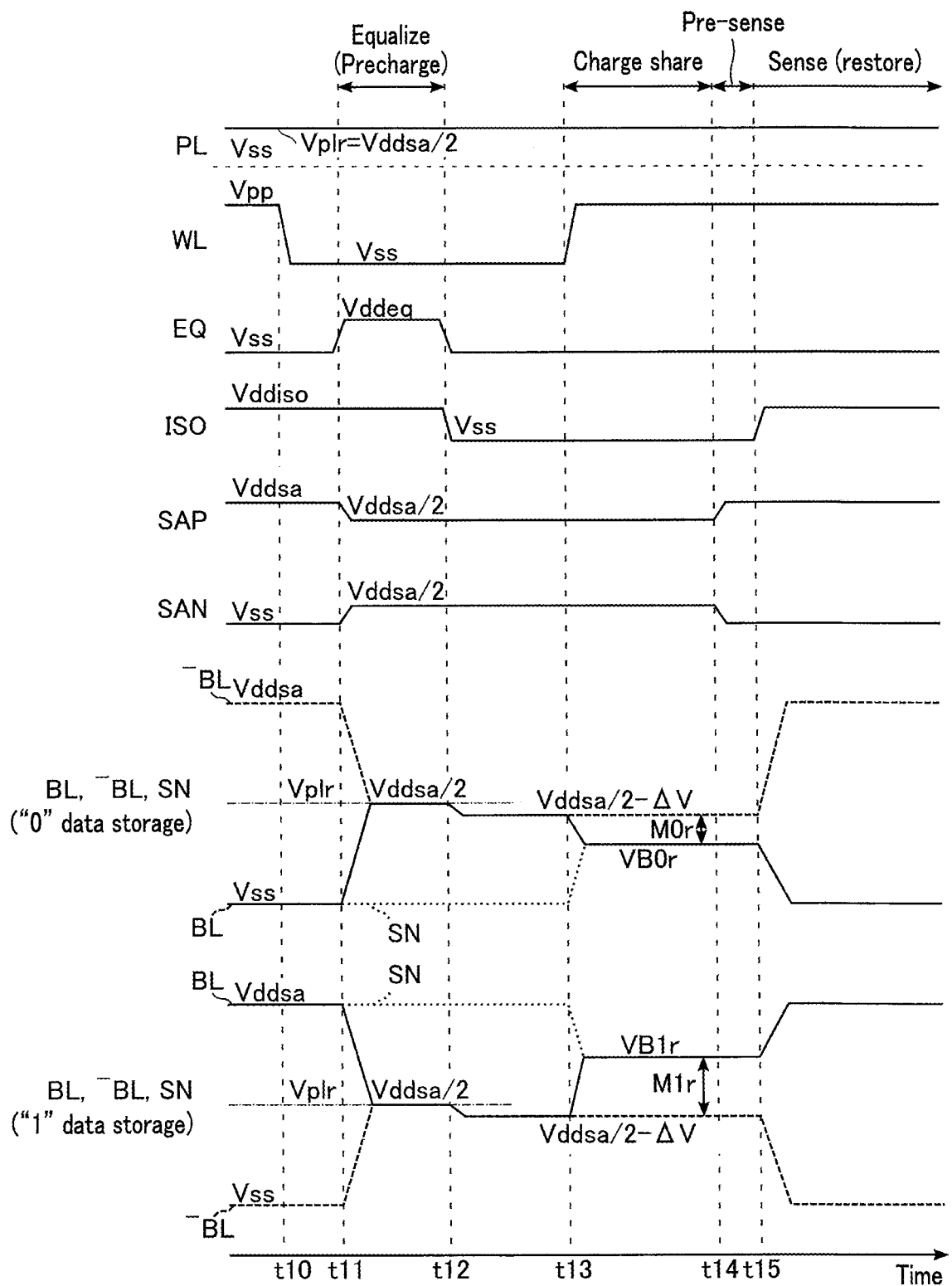
F I G. 7

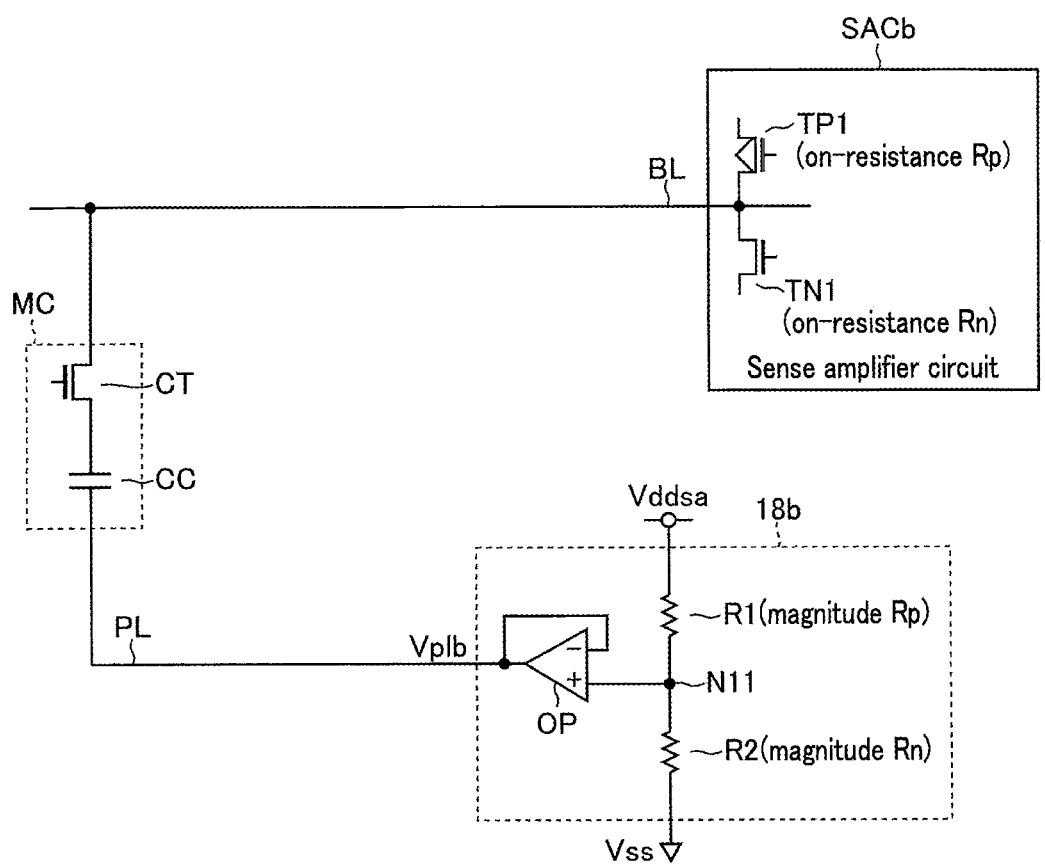
F I G. 9

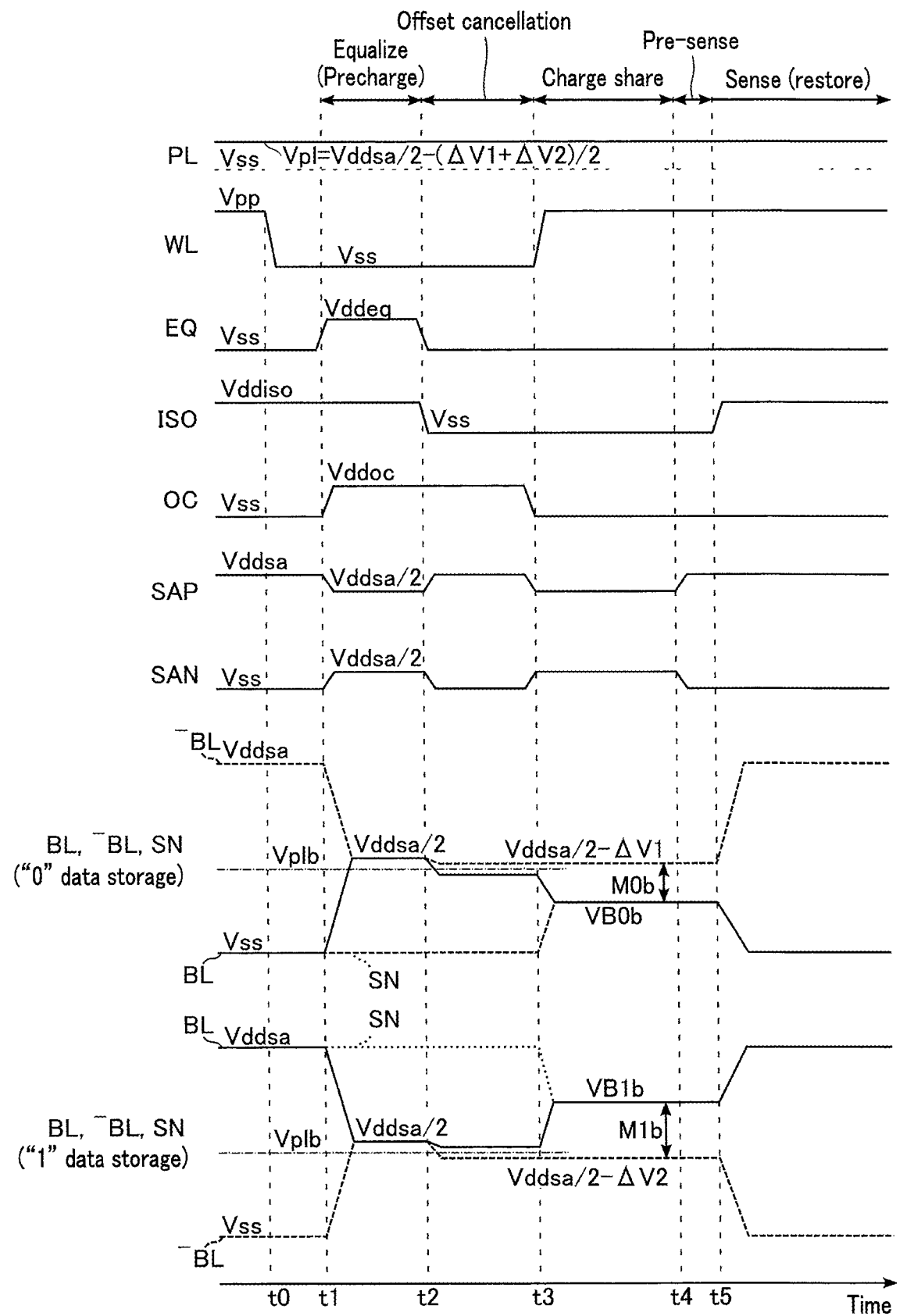
F I G. 10

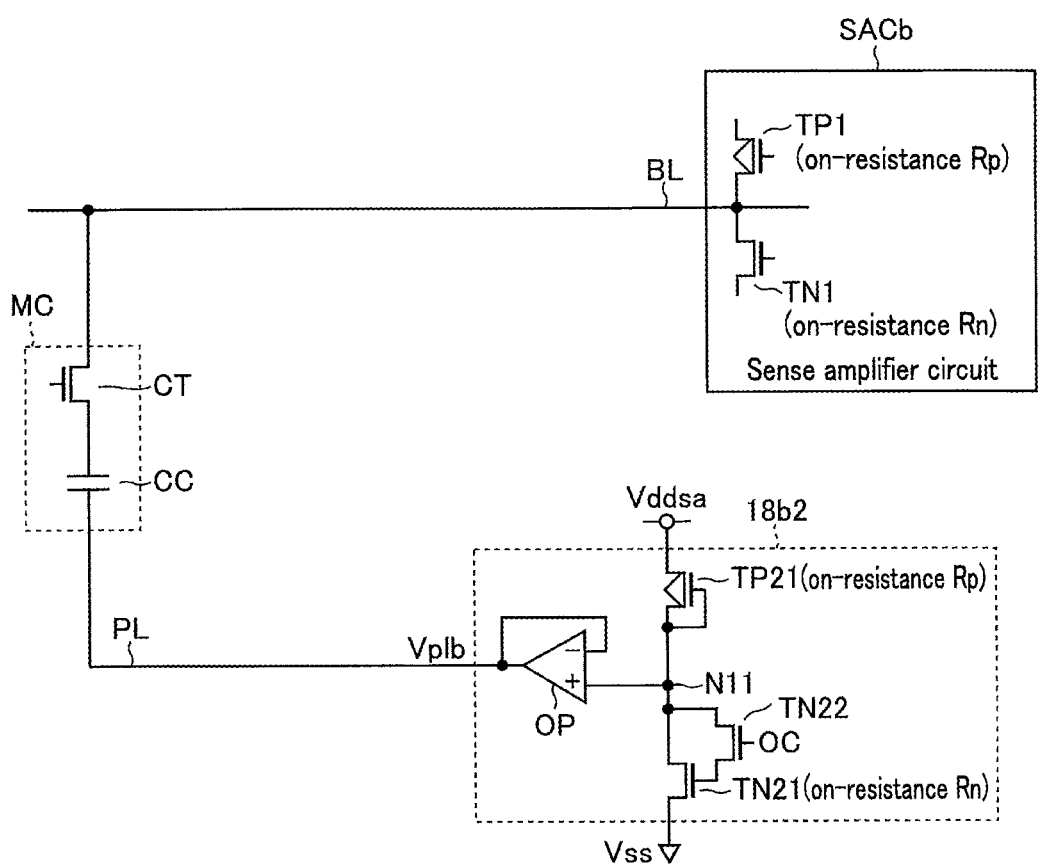
F I G. 12

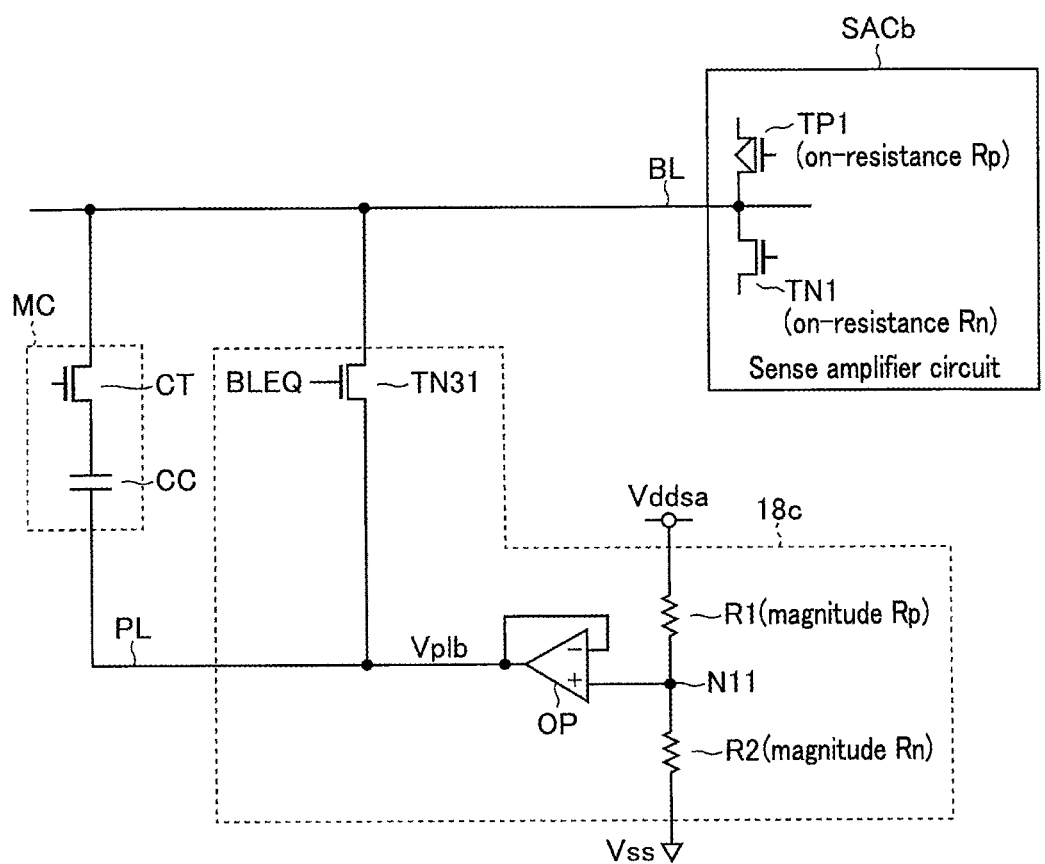
F I G. 13

DRAM MEMORY DEVICE WITH OXIDE SEMICONDUCTOR ACCESS TRANSISTOR AND METHOD OF CONTROLLING PLATE LINE POTENTIAL

CROSS-REFERENCE TO RELATED APPLICATIONS

This application is based upon and claims the benefit of priority from Japanese Patent Application No. 2021-50690, filed Mar. 24, 2021, the entire contents of which are incorporated herein by reference.

FIELD

Embodiments relate generally to semiconductor memory devices.

BACKGROUND

As a memory device, a dynamic random access memory DRAM) is known. A memory cell of the DRAM includes a capacitor and a transistor. The memory cell stores data, based on the charge stored in the capacitor. The potential based on the data stored in a memory cell of a data read target is amplified by a sense amplifier, and the stored data is determined thereby.

BRIEF DESCRIPTION OF THE DRAWINGS

FIG. 1 shows functional blocks of a semiconductor memory device of the first embodiment and related components.

FIG. 3 shows how a leak current is in the memory cell of the first embodiment and how a leak current is in a reference memory cell.

FIG. 7 shows how potentials of some components of a reference semiconductor memory device change with time.

FIG. 9 shows components of a potential generator of the second embodiment and the related components, and illustrates how the components are coupled.

FIG. 10 shows how potentials of some components of a semiconductor memory device of the second embodiment change with time.

FIG. 12 shows components of a potential generator of a modification of the second embodiment and the related components, and illustrates how the components are coupled.

FIG. 13 shows components of a potential generator of the third embodiment and related components, and shows how the components are coupled.

DETAILED DESCRIPTION

Figure 2:
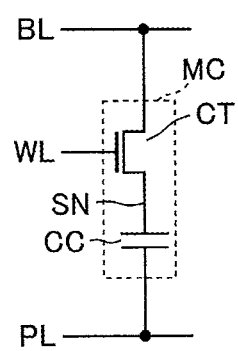
FIG. 2 shows components of a memory cell of the first embodiment and shows how they are coupled.

In general, according to one embodiment, a semiconductor memory device includes: a memory cell; a bit line; a sense amplifier; and a potential generator. The memory cell includes capacitor including a first end and a second end, and a first transistor. The first transistor includes a third end and a fourth end, is coupled to the first end at the fourth end, and contains an oxide semiconductor. The bit line is coupled to the third end. The sense amplifier is coupled to the bit line and coupled between a first node of a first potential and a second node of a second potential lower than the first potential. The potential generator is configured to supply the second end with a fourth potential that is different from a third potential intermediate between the first potential and the second potential.

Embodiments will now be described with reference to the figures. In the following description, components with substantially the same functions and configurations will be referred to with the same reference numerals, and repeated descriptions may be omitted. In order to distinguish components having substantially the same function and configuration from each other, an additional numeral or letter may be added to the end of each reference numeral.

The entire description of a particular embodiment also applies to another embodiment unless explicitly mentioned otherwise or obviously eliminated.

It is not necessary that functional blocks be distinguished as in the following examples. For example, some of the functions may be implemented by functional blocks different from those illustrated below. Furthermore, an illustrated functional block may be divided into functional sub-blocks.

In the specification and the claims, a phrase of a particular first component being "coupled" to another second component includes the first component being coupled to the second component either directly or via one or more components which are always or selectively conductive.

1. First Embodiment

1.1. Configuration (Structure)

FIG. 1 shows functional blocks of a semiconductor memory device of the first embodiment. As shown in FIG. 1, the semiconductor memory device 1 is controlled by a memory controller 2. The semiconductor memory device 1 includes a memory cell array 11, an input and output circuit 12, a control circuit 13, a row selector 14, a column selector 15, a write circuit 16, a read circuit 17, a potential generator 18 and a sense amplifier 19.

The memory cell array 11 includes a plurality of memory cells MC, a plurality of word lines WL, a plurality of bit lines BL and a plate line PL. Each memory cell MC can store 1 bit of data. Each memory cell MC is coupled between one bit line BL and one plate line PL, and is coupled to one word line WL. The word line WL is associated with a row. The bit line BL is associated with a column. One memory cell MC is identified by selecting one row and one column.

The input and output circuit 12 receives a control signal CNT, a command CMD, an address signal ADD and data DAT from the memory controller 2. The input and output circuit 12 transmits the data DAT to the memory controller 2. The data DAT is write data where the data is to be written in the semiconductor memory device 1. The data DAT is read data where the data has been read from the semiconductor memory device 1.

The control circuit 13 receives the control signal CNT and the command CMD from the input and output circuit 12. The control circuit 13 controls the write circuit 16 and the read circuit 17, based on a control and the command CMD indicated by the control signal CNT.

The potential generator 18 generates a plurality of potentials of different magnitudes, under the control of the control circuit 13. The potential generator 18 supplies the generated potentials to the memory cell array 11, the write circuit 16 and the read circuit 17.

The write circuit 16 performs processing and control for writing data to the memory cells MC. The write circuit 16 receives write data Dw from the input and output circuit 12. The write data Dw is data to be written to a memory cell MC of a data write target. The write circuit 16 receives one or more potentials used in data write from the potential generator 18. The write circuit 16 supplies one or more potentials used for data write to the column selector 15, under the control of the control circuit 13 and based on the write data Dw.

The read circuit 17 performs processing and control for reading data from the memory cells MC. The read circuit 17 receives one or more potentials used in data read from the potential generator 18. Based on the control of the control circuit 13, the read circuit 17 identifies what data is stored in the memory cell MC, using potentials used for reading data. The identified data is supplied to the input and output circuit 12 as read data Dr.

The row selector 14 receives an address signal ADD from the input and output circuit 12. The row selector 14 supplies a potential received from the potential generator 18 to the memory cell array 11, to thereby select the row identified by the received address signal ADD and one associated word line WL.

The column selector 15 receives an address signal ADD from the input and output circuit 12. The column selector 15 supplies the potential received from the potential generator 18 to the memory cell array 11, to thereby select the column identified by the received address signal ADD and the associated bit line BL.

The sense amplifier 19 includes a plurality of sense amplifier circuits SAC (not shown). During data read, the sense amplifier 19 amplifies the potential on a bit line BL in order to identify the data stored in the memory cell MC of a data read target.

1.1.1. Memory Cell

FIG. 2 shows components of the memory cell of the first embodiment and how they are coupled. As shown in FIG. 2, each memory cell MC includes a cell capacitor CC and an n-type metal oxide semiconductor field effect transistor (MOSFET) CT. The cell capacitor CC is coupled to the plate line PL at one end and is coupled to one end of the transistor CT at the other end. The cell capacitor CC stores data by using the charge stored at the node coupled to the transistor CT. The node coupled to the transistor CT of the cell capacitor CC may be hereinafter referred to as a storage node SN. The state in which the storage node stores charge or not is associated with the state in which the memory cell MC stores "1" data or "0" data, respectively. By way of example, the state in which the storage node SN stores charge will be regarded as a state in which the memory cell MC stores "1" data, and the state in which the storage node SN does not store the charge will be regarded as a state in which the memory cell MC stores "0" data.

The transistor CT is coupled to one bit line BL at the other end and is coupled to one word line WL at the gate. The semiconductor forming part of the transistor CT provides at least a region in which a channel is formed, or a channel region. The material of the semiconductor includes an oxide semiconductor or is substantially composed of the oxide semiconductor. In the present specification and claims, the expression "substantially composed" is intended to mean that unintended impurities are allowed to be contained in a substance mentioned after "substantially composed of". The oxide semiconductor refers to an oxide having the characteristics of a semiconductor. An example of the oxide semiconductor is an oxide containing one or more of indium (In), gallium (Ga), aluminum (Al), zinc (Zn) and tin (Sn). More specifically, the oxide semiconductor may be composed of, for example, In, Ga, Zn, and O, or may be composed of In, Al, Zn and O.

In general, the bandgap of an oxide semiconductor is wider than the bandgap of silicon. Therefore, the conductivity of an oxide semiconductor applied with no voltage is lower than the conductivity of silicon applied with no voltage. Thus, the transistor containing the oxide semiconductor has a cutoff characteristic higher than the cutoff characteristic of the transistor containing the silicon. Hereinafter, a transistor containing an oxide semiconductor may be referred to as an oxide semiconductor transistor, and a transistor containing silicon may be referred to as a silicon transistor. Since the cutoff characteristic of the oxide semiconductor transistor is higher than the cutoff characteristic of the silicon transistor, the leak current during the OFF state of the oxide semiconductor transistor is lower than the leak current during the OFF state of the silicon transistor. Therefore, in the memory cell MC, the leak current from the storage node SN to the transistor CT is small. Thus, the memory cell MC has a higher data retention capability (retention characteristic) than the case where the memory cell MC includes the silicon transistor.

On the other hand, in the memory cell MC including the transistor CT containing the oxide semiconductor, the following phenomenon can occur. FIG. 3 shows how the leak current is in the memory cell of the first embodiment and how the leak current is in a reference memory cell. FIG. 3 shows the reference memory cell MCR on the left side and shows the memory cell MC of the first embodiment on the right side.

The memory cell MCR includes a transistor CTR in place of the transistor CT of the memory cell MC. The transistor CTR is a silicon transistor. The cell capacitor CC can cause a current leak between the storage node SN and the plate line PL. As described with reference to FIG. 3, in general, a transistor can generate a leak current from the source or drain towards the back gate. The transistor CTR produces a higher leak current than the transistor CT, due to the difference of semiconductor materials used. The leak current in the transistor CTR is larger than the leak current caused by the cell capacitor CC. Therefore, in the transistor CTR, most of the charge from the storage node SN flows to the back gate via the transistor CTR.

On the other hand, the leak current in the transistor CT is small, and is smaller than the leak current caused by the cell capacitor CC. Therefore, in the transistor CT, most of the charge from the storage node SN flows to the plate line PL.

1.1.2. Sense Amplifier

Figure 4:
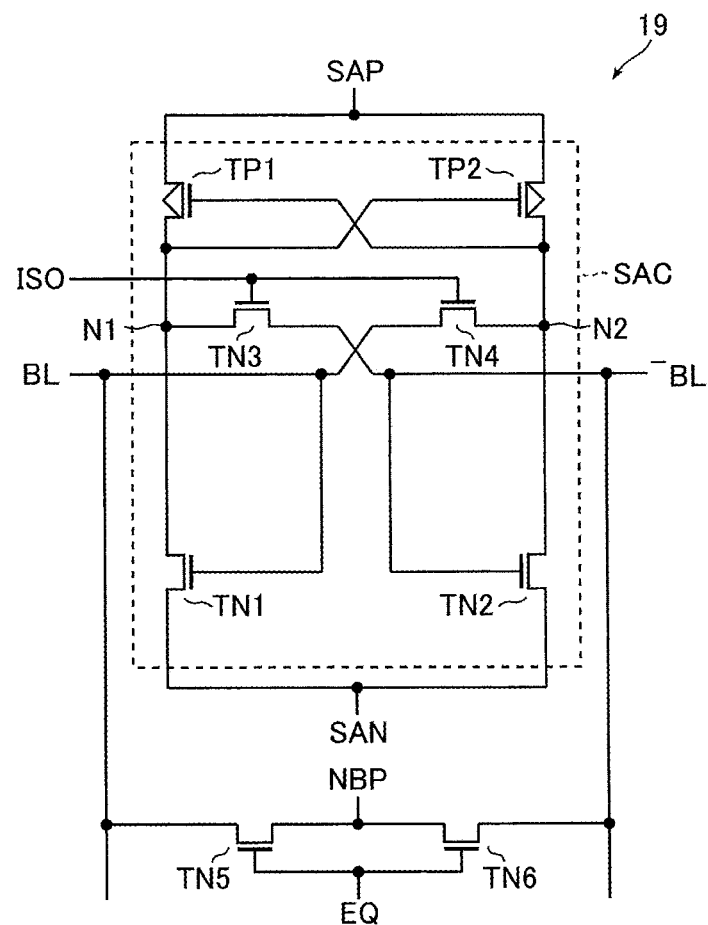
FIG. 4 shows components of part of a sense amplifier of the first embodiment, and shows how the components are coupled.

FIG. 4 shows components of part of a sense amplifier of the first embodiment, and shows how the components are coupled. As described above, the sense amplifier 19 includes a plurality of sense amplifier circuits SAC.

FIG. 4 shows one sense amplifier circuit SAC. FIG. 4 also shows components related to the sense amplifier circuit SAC and shows how the components are coupled.

As shown in FIG. 4, the sense amplifier circuit SAC includes p-type MOSFETs TP1 and TP2 and n-type MOSFETs TN1, TN2, TN3 and TN4. The sense amplifier 19 further includes transistors TN5 and TN6. The transistor TP1 is coupled between a node SAP and a node N1. The node SAP is supplied with a potential, for example, from the potential generator 18. The node SAP is supplied with one of a power supply potential Vddsa and a potential Vddsa/2, which switch dynamically from one to the other. The power supply potential Vddsa may have the same magnitude as the first power supply potential Vdd used in the semiconductor memory device 1, or may have a magnitude different from the power supply potential Vdd. The transistor TP1 is coupled to a node N2 at the gate. The transistor TP1 has a resistance, Rp of a certain magnitude while it is on, or an on-resistance Rp.

The transistor TN1 is coupled between a node N1 and a node SAN. The node SAN is supplied with a potential, for example, from the potential generator 18. The node SAN is supplied with one of the potential Vddsa/2 and a ground potential (common potential) Vss (for example, 0V), which switch dynamically from one to the other. The following description is based on the example where the Vss is 0V. The transistor TN1 is coupled to one bit line BL at the gate. The transistor TN1 has an on-resistance Rn.

The transistor TP2 is coupled between the node SAP and the node N2. The transistor TP2 is coupled to the node N1 at the gate. The transistor TP2 has an on-resistance having substantially the same magnitude as the on-resistance Rp. In the present specification, where two components are described as having "substantially the same" characteristics, this means that the two components are formed with the aim of providing the same material. The expression does not exclude a case where the two components are not completely the same due to unavoidable reasons, such as technical restrictions in the manufacture of these components.

The transistor TN2 is coupled between the node N2 and the node SAN. The transistor TN2 has an on-resistance having substantially the same magnitude as the on-resistance Rn. The gate of the transistor TN2 functions as a node ⁻BL. The node ⁻BL may be hereinafter referred to as a complementary bit line ⁻BL. The complementary bit line ⁻BL functions as a node having a reference potential (or a base potential). The reference potential is used at the start of data read to determine the potential that appears in the bit line BL, based on the data stored in the memory cell MC of a data read target. The memory cell MC of the data read target may be hereinafter referred to as a selected memory cell MC.

The transistor TN3 is coupled between the node N1 and the complementary bit line ⁻BL. The transistor TN3 receives a signal ISO at the gate. The signal ISO is supplied, for example, from a component different from the sense amplifier circuit SAC of the read circuit 17.

The transistor TN4 is coupled between the node N2 and the bit line BL. The transistor TN4 receives the signal ISO at the gate. The signal ISO is supplied, for example, from a component different from the sense amplifier circuit SAC of the read circuit 17.

The transistor TN5 is coupled between at least one bit line BL and a node NBP. The node NBP receives a precharge potential Vpc from the potential generator 18. The precharge potential Vpc is (Vddsa−Vss)/2, is Vddsa/2 because of Vss being 0V and, and functions as a reference potential as well. Hereinafter, the precharge potential Vpc may be referred to as a precharge potential (Vddsa/2). The transistor TN5 receives a signal EQ at the gate. The signal EQ is supplied, for example, from a component different from the sense amplifier circuit SAC of the read circuit 17.

The transistor TN6 is coupled between at least one complementary bit line ⁻BL and the node NBP. The transistor TN6 receives a signal EQ at the gate.

The transistors TP1 and TN1 form a first inverter circuit, and the transistors TP2 and TN2 form a second inverter. While the transistors TN3 and TN4 are on, the first inverter circuit and the second inverter circuit are cross-coupled. That is, the input node and the output node of the first inverter circuit are coupled to the output node and the input node of the second inverter circuit, respectively.

1.1.3. Potential Generator

The potential generator 18 generates a potential Vpl of a certain magnitude, and the potential Vpl is supplied to the plate line PL. The potential of a bit line BL coupled to the selected memory cell MC fluctuates during data read due to various factors, so that the magnitude of the potential Vpl is determined based on how the fluctuation may be. The bit line BL coupled to the selected memory cell MC may be hereinafter referred to as a selected bit line BL. The complementary bit line ⁻BL coupled to the sense amplifier circuit SAC coupled to a selected bit line BL may be hereinafter referred to as a selected complementary bit line ⁻BL.

Figure 5:
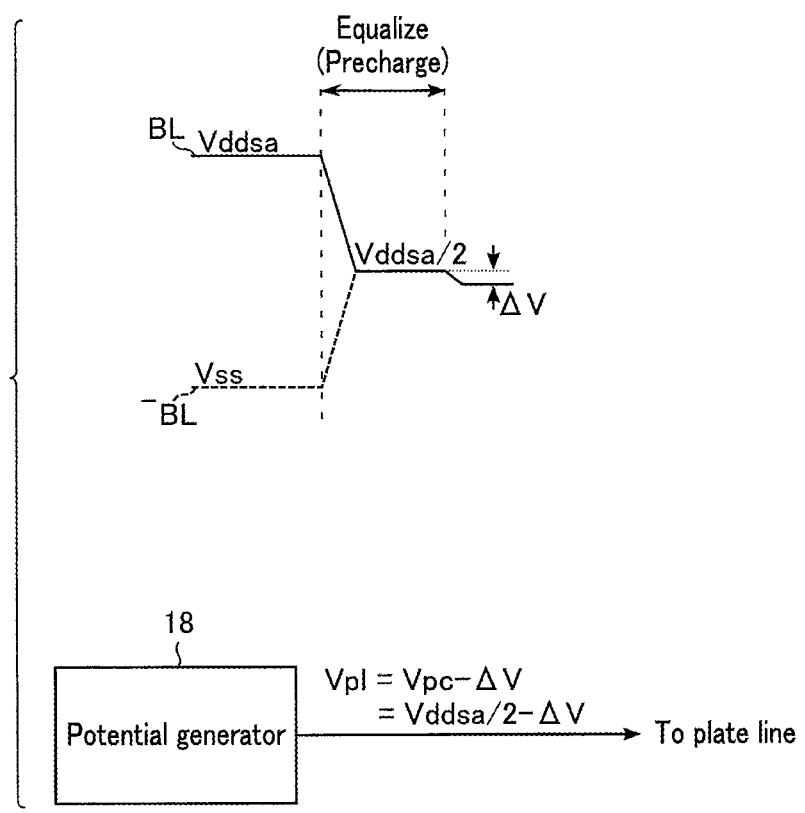
FIG. 5 shows part of the potentials of a bit line of the first embodiment and potentials output from a potential generator.

Specifically, the potential Vpl can be determined as below. As shown in the upper part of FIG. 5 and described later with reference to FIG. 6, the selected bit line BL is precharged to a precharge potential, which is intermediate between the power supply potential Vddsa and the ground potential Vss (=0V), that is, a precharge potential Vpc having a magnitude of Vddsa/2, and after the precharging ends, is added with a potential that is based on the data stored in the selected memory cell MC. After the end of the precharging, the potential of the selected bit line BL can vary from Vddsa/2 due to various factors before the potential based on the data stored in the selected memory cell MC is added. The potential Vpl can be determined based on the amount of this variation. A more specific description of this will be given below.

As described with reference to FIG. 3, in the transistor CT, a leak current is caused between the storage node SN and the plate line PL, which changes the potential of the storage node SN. The leak current causes the potential of the storage node SN to come closer to the potential of the plate line PL. The potential of the plate line PL is lowered in order to suppress the influence, in particular, of a case where the potential of the storage node SN rises due to the leak current. In addition, when the precharging ends, the potentials of the selected bit line BL and the selected complementary bit line ⁻BL may lower from Vddsa/2 by a certain positive magnitude $\Delta V$ due to capacitative coupling of gate electrodes of transistors TN5 and TN6 and the selected bit line BL and the selected complementary bit line ⁻BL. Based on this, the magnitude of the potential Vpl of the plate line PL can be Vddsa/2−$\Delta V$, as shown in the lower portion of FIG. 5.

1.2. Operation

Figure 6:
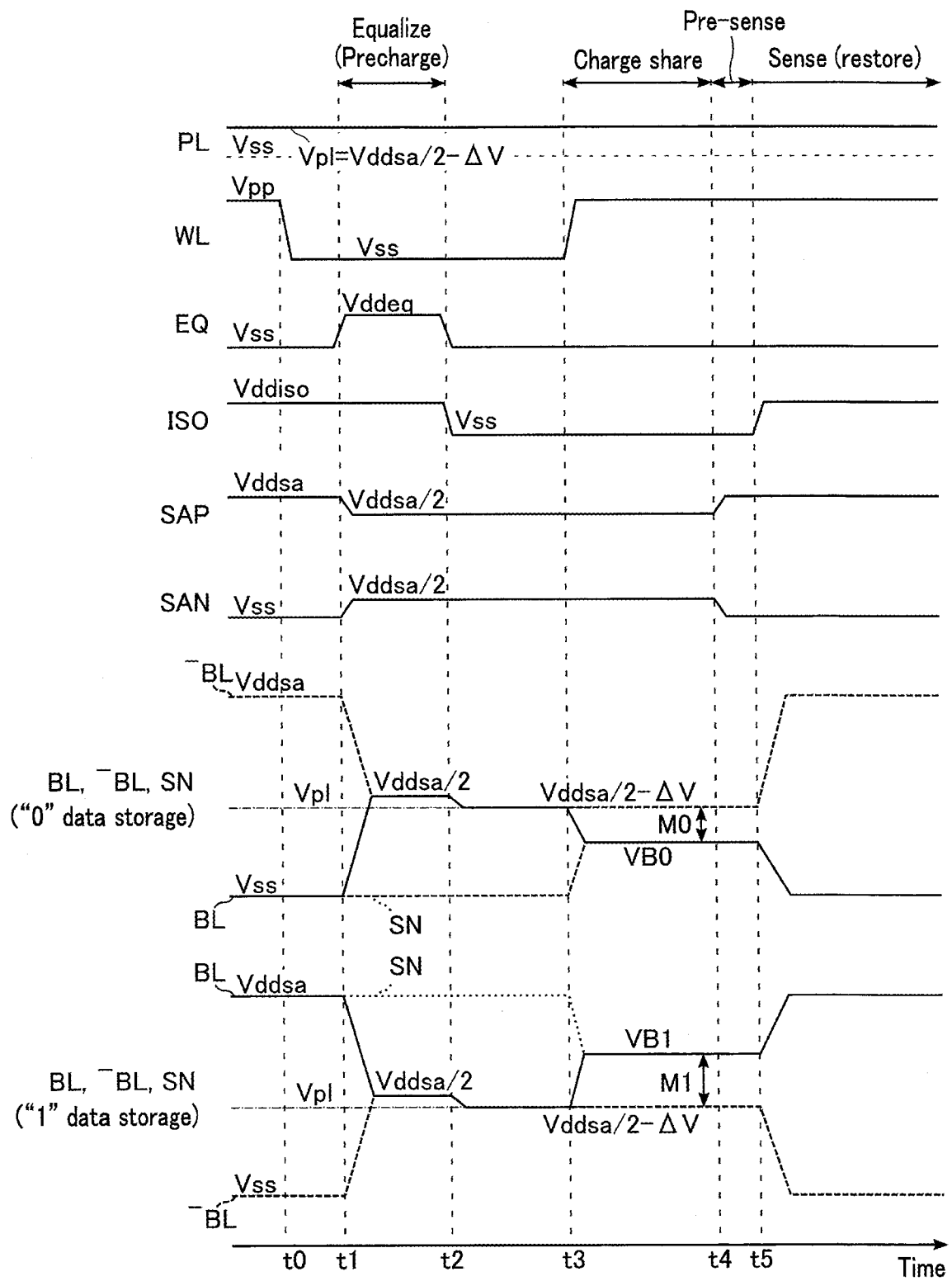
FIG. 6 shows how potentials of some components of the semiconductor memory device of the first embodiment change with time during data read.

FIG. 6 shows how potentials of some components of the semiconductor memory device of the first embodiment change with time during data read. Of the components whose potentials are shown, the word line WL is a word line WL coupled to a selected memory cell MC, and may be hereinafter referred to as a selected word line WL.

As shown in FIG. 6, the potential of the plate line PL is maintained at a potential Vpl.

At the start of the period shown in FIG. 6, the potential of each component is as follows. The selected word line WL is asserted and therefore has a power supply potential Vpp. The power supply potential Vpp is an internal power supply potential, and, for example, has a magnitude different from that of the power supply potential Vdd. With the application of the power supply potential Vpp, the transistor CT of the selected memory cell MC is on, and the cell capacitor CC of the selected memory cell MC is coupled to the selected bit line. BL.

The signal EQ is negated and therefore has the ground potential Vss. Thus, the transistors TN5 and TN6 are off, and neither the selected bit line BL nor the selected complementary bit line ⁻BL is coupled to the node NBP having the precharge potential Vpc. That is, neither the selected bit line BL nor the selected complementary bit line ⁻BL is precharged.

The signal ISO is asserted and therefore has the power supply potential Vddiso. The power supply potential Vddiso is an internal power supply potential, and, for example, has a magnitude different from that of the power supply potential Vdd. With the application of the power supply potential vddiso, the transistors TN3 and TN4 are on, and the selected bit line BL and the selected complementary bit line ⁻BL are coupled to the nodes N2 and N1, respectively.

The node SAP has the power supply potential Vddsa and the node SAN has the ground potential Vss. Therefore, the sense amplifier circuit SAC is supplied with power and is on, that is, in a state in which it can operate.

Based on the above potential states, one of the selected bit line BL and the selected complementary bit line ⁻BL has the power supply potential Vddsa, and the other has the ground potential Vss. Which of the selected bit line BL and the selected complementary bit line ⁻BL has the power potential Vddsa depends on whether the selected memory cell MC stores "0" data or "1" data. Where the selected memory cell MC stores "0" data, the selected bit line BL has the ground potential Vss. Based on this, the storage node SN has the ground potential Vss. On the other hand, where the selected memory cell MC stores "1" data, the selected bit line BL has the power supply potential Vddsa. Based on this, the storage node SN has the power supply potential Vddsa. The case where the selected memory cell MC stores "0" data may be hereinafter referred to as a "0" data storage case, and the case where the selected memory cell MC stores "1" data may be hereinafter referred to as a "1" data storage case.

At the start of data read, i.e., at time t0, the selected word line WL is negated, that is, the potential of the selected word line WL is set to the ground potential Vss. Therefore, the transistor CT of the selected memory cell MC is turned off, and the cell capacitor CC of the selected memory cell MC is decoupled from the selected bit line BL. The selected word line WL continues to have the potential Vss until time t3. The selected word line may be applied with a negative potential Vnn in place of the ground potential Vss.

The period from time t1 to time t2 is an equalization period. At time t1, the potential of the node SAP is set to a potential Vddsa/2, and the potential of the node SAN is also set to the potential Vddsa/2. Therefore, the sense amplifier circuit SAC is not supplied with power and does not have the function of amplifying the potential. The node SAP and the node SAN continue to have the potential Vddsa/2 until time t4. Based on strict description, the potential applied to the node SAP and SAN is (Vddsa+Vss)/2. The ongoing description is, however, based on an example where the ground potential is 0V, and therefore the applied potential is Vddsa/2 as described.

Further, at time t1, the signal EQ is asserted, that is, the potential of the signal EQ is set to the power supply potential Vddeq. The power supply potential Vddeq is an internal power supply potential, and, for example, has a magnitude different from that of the power supply potential Vdd. With the application of the power supply potential Vddeq, the transistors TN5 and TN6 are turned on, and the selected bit line BL and the selected complementary bit line ⁻BL are coupled to the node NBP. As a result, the selected bit line BL and the selected complementary bit line ⁻BL are equalized to the same potential. Specifically, both the selected bit line BL and the selected complementary bit line ⁻BL are precharged to a precharge potential Vpc, that is, the potential Vddsa/2.

At time t2, the signal EQ is negated. Thus, the precharging of both the selected bit line BL and the selected complementary bit line ⁻BL ends. Further, the signal ISO is negated, that is, the potential of the signal ISO is set to the ground potential Vss. Thus, the transistors TN3 and TN4 are turned off, and the selected bit line BL and the selected complementary bit line ⁻BL are decoupled from the nodes N2 and N1 of the sense amplifier circuit SAC, respectively, or isolated (isolation).

Since the precharging ends and the isolation starts at time t2, the potentials of the selected bit line BL and the selected complementary bit line ⁻BL fluctuate from the potential Vddsa/2, and specifically become Vddsa/2−ΔV.

The period from time t3 to time t4 is a charge sharing period. At time t3, the selected word line WL is asserted. As a result, charge sharing starts. By the charge sharing, the charge stored in the selected bit line BL and the charge stored in the storage node SN of the selected memory cell MC are shared. As a result, the potential of the selected bit line BL rises or falls, based on the data stored in the selected memory cell MC. In the "0" data storage case, the potential of the storage node SN rises toward the potential of the selected bit line BL, i.e., Vddsa/2−ΔV, and the potential of the selected bit line BL falls. The storage node SN and the selected bit line EL come into a state of having a potential VB0 at which the rising potential of the storage node SN and the falling potential of the selected bit line BL become equal to each other. The potential of the selected complementary bit line ⁻BL is maintained.

On the other hand, in the "1" data storage case, the potential of the storage node SN falls toward the potential of the selected bit line BL, i.e., Vddsa/2−ΔV, and the potential of the selected bit line BL rises. The storage node SN and the selected bit line BL come into a state of having a potential VB1 at which the falling potential of the storage node SN and the rising potential of the selected bit line BL become equal to each other. The potential of the selected complementary bit line ⁻BL is maintained.

The period from time t4 to time t5 is a pre-sense period. At time t4, the potential of the node SAP is set to the power supply potential Vddsa, and the potential of the node SAN is set to the ground potential Vss. As a result, the potential of the selected bit line BL rises or falls, based on the data stored in the selected memory cell MC. Further, the potential of the drain of the transistor TN1 whose gate is coupled to the selected bit line BL, i.e., the potential of the node N1, also rises or falls, based on the data stored in the selected memory cell MC. That is, in the "0" data storage case, the transistor TN1 is turned off, which causes the potential of the node N1 to rise toward the power supply potential Vddsa. On the other hand, in the "1" data storage case, the transistor TN1 is turned on, which causes the potential of the node N1 to fall toward the ground potential Vss.

The period after time t5 is a sense and restore period. At time t5, the signal ISO is asserted. Thus, the transistors TN3 and TN4 are turned on, and the sense amplifier circuit SAC amplifies the potential of one of the nodes N1 and N2 to the power supply potential Vddsa and the potential of the other to the ground potential Vss. Owing to the amplification by the sense amplifier circuit SAC, in the "0" data storage case, the potential of the selected bit line BL is lowered to the ground potential Vss, and the potential of the selected complementary bit line ⁻BL is raised to the power supply potential Vddsa. On the other hand, in the "1" data storage case, the potential of the selected bit line BL is raised to the power supply potential Vddsa, and the potential of the selected complementary bit line ⁻BL is lowered to the ground potential Vss.

The operation shown in FIG. 6 is merely an example. The pre-sensing and the sensing (or, restoring) is not limited to those shown in FIG. 6. For example, the sense can be performed without the pre-sense. In this case, at time t5, the potential of the node SAP may be set to the power supply potential Vddsa and the potential of the node SAN may be set to the ground potential Vss.

Reference symbols M0 and M1 in the figure will be described later.

1.3. Advantages (Effects)

According to the first embodiment, it is possible to provide a semiconductor memory device in which malfunction is suppressed, as described below.

First, for a comparison purpose, a reference semiconductor memory device 100 will be described with reference to FIG. 7. FIG. 7 shows how potentials of some components of the reference semiconductor memory device 100 change with time. As shown in FIG. 7, in the reference semiconductor memory device 100, the potential of the plate line PL is maintained at a potential Vplr. The potential Vplr has a magnitude of Vddsa/2. At times t10, t11, t12, t13 and t15 of FIG. 7, operations corresponding to the operations at times t0, t1, t2, t3, and t5 of FIG. 6 of the first embodiment are performed, respectively.

In the case of the reference semiconductor memory device 100, where the potential of the selected bit line BL and the potential of the selected complementary bit line ⁻BL maintain Vddsa/2 after the end of precharging (an ideal case), the potentials of the selected bit line BL and the complementary bit line ⁻BL start to change from the potential Vddsa/2, due to the charge sharing. As described with reference to FIG. 5, however, the potentials of the selected bit line BL and the selected complementary bit line ⁻BL may lower from Vddsa/2 after the end of precharging, that is, at the start of charge sharing. Due to this, the following phenomenon may occur.

That is, in the "1" data storage case, the reference potential on the selected complementary bit line ⁻BL has a magnitude of Vddsa/2−ΔV, and the selected bit line BL has a potential VB1r of a certain magnitude. The difference between the reference potential on the selected complementary bit line ⁻BL and the potential on the selected bit line BL is M1r of a certain magnitude, and M1r serves as a margin in the "1" data storage case and may be referred to as a "1" data storage case margin M1r. The "1" data storage case margin M1r is greater than the "1" data storage case margin of an ideal case (a case where the selected bit line BL and the selected complementary bit line ⁻BL have a potential of Vddsa/2 at the start of charge sharing). Therefore, the fall of the potentials of the selected bit line BL and the selected complementary bit line ⁻BL from Vddsa/2 at the start of charge sharing leads to increase of the "1" data storage case margin M1r.

On the other hand, in the "0" data storage case, the reference potential on the selected complementary bit line ⁻BL has a magnitude of Vddsa/2−ΔV, and the selected bit line BL has a potential VB0r of a certain magnitude. The difference between the reference potential on the selected complementary bit line ⁻BL and the potential on the selected bit line BL is M0r of a certain magnitude, and M0r serves as a margin in the "0" data storage case and may be hereinafter referred to as a "0" data storage case margin M0r. The "0" data storage case margin M0r is smaller than the "0" data storage case margin of an ideal case (a case where the selected bit line BL and the selected complementary bit line ⁻BL have a potential of Vddsa/2 at the start of charge sharing). Therefore, the fall of the potentials of the selected bit line BL and the selected complementary bit line ⁻BL from Vddsa/2 at the start of charge sharing leads to decrease of the "0" data storage case margin M0r.

The difference between the reference potential on the selected complementary bit line ⁻BL and the potential on the selected bit line BL, that is, the margin, contributes to accurate data determination in the sense amplifier circuit SAC. Therefore, in the "0" data storage case, a small margin M0r may lead to a malfunction of the sense amplifier circuit SAC.

Since the transistor CT is an oxide semiconductor transistor, a leak current may be generated between the storage node SN and the plate line PL, and the potential of the storage node SN changes to come close to the falling or rising potential Vpl of the plate line PL that is falling or rising, as described with reference to FIG. 3. Therefore, in the "0" data storage case, the potential of the storage node SN is higher than that of the case where no leak current is generated. On the other hand, the potential VB0r of the selected bit line BL, which is reached due to charge sharing, is equal to a potential where the potential of the storage node SN and the potential of the selected bit line BL become equal as described with reference to FIG. 7. Therefore, the potential which the selected bit line BL has after the end of precharging in the "0" data storage case is greater than that in the case where no leak current is generated. Therefore, due to the leak current, the "0" data storage case margin M0r can be further smaller than in the case of no leak current.

According to the first embodiment, the potential Vpl of the plate line PL has a magnitude based on the potentials which the selected bit line BL and the selected complementary bit line ⁻BL have after the end of precharging, and is set to a potential lower than the precharge potential Vpc. In particular, the potential Vpl can be lower than the precharge potential (Vddsa/2) by substantially the same magnitude as ΔV, which is the magnitude by which the potentials of the selected bit line BL and the selected complementary bit line ⁻BL lower after the end of precharging. Therefore, the potential Vpl becomes lower than the potential Vplr (=Vddsa/2) of the plate line PL in the reference semiconductor memory device 100. Due to the charge sharing, the potential of the storage node SN rises or falls toward the potential Vpl, and the potentials of the storage node SN and the selected bit line BL become substantially equal to each other. The selected bit line BL has a potential VB0 of a certain magnitude in the "0" data storage case and has a potential VB1 of a certain magnitude in the "1" data storage case. The "0" data storage case margin is M0, and the "1" data storage case margin is M1. Since the potential Vpl of the plate line PL is lower than the precharge potential (Vddsa/2), the potentials VB0 and VB1 which the selected bit line BL has after the charge sharing become lower than the potentials VB0r and VB1r of the reference semiconductor memory device 100, respectively. Therefore, the "0" data storage case margin M0 in the first embodiment becomes larger than the "0" data storage case margin M0r in the reference semiconductor memory device 100. In addition, the rise of potential of the storage node SN in the "0" data storage case due to the leak current through the capacitor CC is suppressed by the potential Vpl of the plate line PL being lower than the precharge potential (Vddsa/2). Thus, the malfunction of the sense amplifier circuit SAC can be suppressed in the "0" data storage case.

2. Second Embodiment

The second embodiment differs from the first embodiment in the configurations of a sense amplifier circuit SAC and a potential generator 18 and in the points related to these. In the description below, the differences from the first embodiment will be mainly described.

2.1. Configuration

The sense amplifier circuit SAC and the potential generator 18 of the second embodiment differ from the sense amplifier circuit SAC and the potential generator 18 of the first embodiment, respectively. In the description below, the sense amplifier circuit SAC and the potential generator 18 of the second embodiment may be referred to as a sense amplifier circuit SACb and a potential generator 18b, respectively, in order to distinguish them from the sense amplifier circuit SAC and the potential generator 18 of the first embodiment. Likewise, a semiconductor memory device 1, a read circuit 17 and a sense amplifier 19 of the second embodiment may be referred to as a semiconductor memory device 1b, a read circuit 17b and a sense amplifier 19b, respectively, in order to distinguish them from the semiconductor memory device 1, the read circuit 17 and the sense amplifier 19 of the first embodiment.

2.1.2. Sense Amplifier

Figure 8:
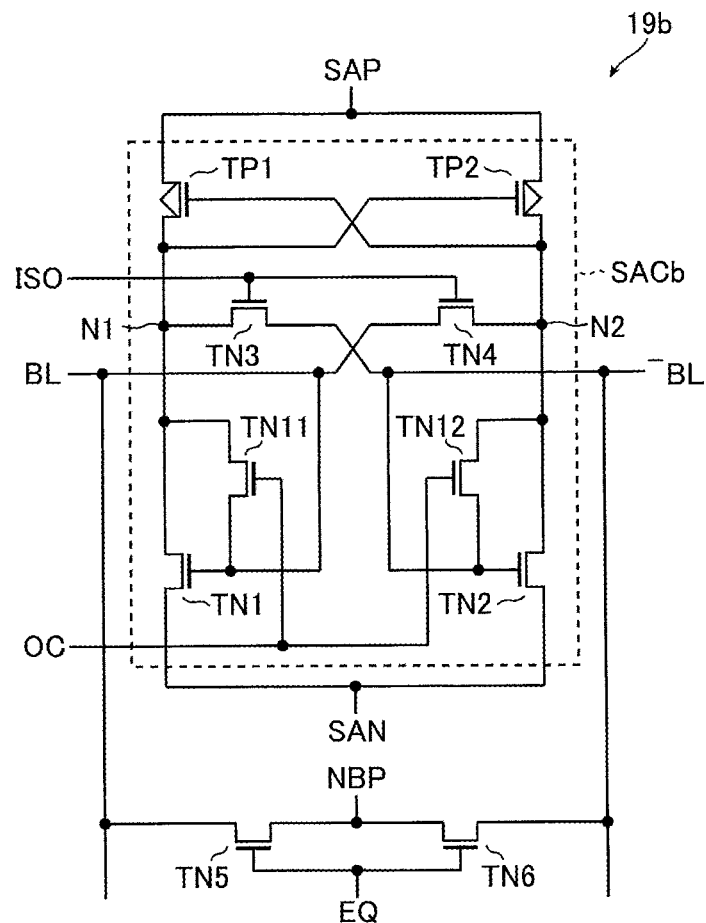
FIG. 8 shows components of part of a sense amplifier of the second embodiment and related components, and shows how the components are coupled.

FIG. 8 shows components of part of the sense amplifier 19b of the second embodiment and also shows how the components are coupled. FIG. 8 shows one sense amplifier circuit SACb. FIG. 8 also shows components related to the sense amplifier circuit SACb and shows how the components are coupled.

As shown in FIG. 8, the sense amplifier circuit SACb includes n-type MOSFETs TN11 and TN12 in addition to the components included in the sense amplifier circuit SAC of the first embodiment.

The transistor TN11 is coupled between the node N1 and the gate of the transistor TN1. The transistor TN11 receives a signal OC at the gate. The signal OC is supplied, for example, from a component different from the sense amplifier circuit SACb of the read circuit 17b.

The transistor TN12 is coupled between the node N2 and the gate of the transistor TN12. The transistor TN12 receives a signal OC at the gate.

2.1.3. Potential Generator

FIG. 9 shows components of the potential generator of the second embodiment and the related components, and also shows how those components are coupled. As shown in FIG. 9, the potential generator 18b includes resistors R1 and R2 and an operational amplifier OP. The resistor R1 has a resistance substantially equal to the on-resistance Rp of the transistor TP1 (and/or TP2). The resistor R1 is coupled between a node that receives a power supply potential Vddsa and a node N11. The resistor R1 can be realized, for example, by an impurity diffusion region in a semiconductor and/or an interconnect formed of polysilicon or metal.

The resistor R2 has a resistance substantially equal to the on-resistance Rn of the transistor TN1 (and/or TN2). The resistor R2 is coupled between the node N11 and a node that receives the ground potential Vss. The resistor R2 can be realized, for example, by an impurity diffusion region in a semiconductor and/or an interconnect formed of polysilicon or metal.

The operational amplifier OP is coupled to the node N11 at the non-inverting input terminal. The operational amplifier OP is coupled to the plate line PL and its own inverting input terminal, at the output terminal. By the operation of the operational amplifier OP, the potential Vplb of the plate line PL is maintained at the potential of the node N11. The potential of the node N11 is equal to a voltage obtaining by dividing the potential difference Vddsa (for an example case of VSS=0V) between the power supply potential Vddsa and the ground potential Vss by the resistors R1 and R2. That is, the potential of the node N11 is equal to the mathematical product of the potential difference Vddsa and the ratio of the resistance of the resistor R2 to the sum of the resistances of the resistors R1 and R2. Therefore, the potential Vplb of the plate line PL is maintained at a magnitude equal to the voltage obtained by dividing the potential difference Vddsa by the ratio of the on-resistances Rp and Rn. More specifically, the potential Vplb of the plate line PL has a magnitude of Vddsa/2−(ΔV1+ΔV2)/2. As will be described later, ΔV1 represents an amount by which the potential of one of the selected bit line BL and the selected complementary bit line ⁻BL lowers after precharging, and ΔV2 represents an amount by which one of the selected bit line BL and the selected complementary bit lines ⁻BL lowers due to end of precharging.

2.2. Operation

FIG. 10 shows how potentials of some components of the semiconductor memory device of the second embodiment change with time.

As described with reference to FIG. 9 and shown in FIG. 10, the potential of the plate line PL is maintained at the potential Vplb.

FIG. 10 is different from FIG. 6 of the first embodiment in that a signal OC is added and how the potentials of the selected bit line BL and the selected complementary bit line ⁻BL change.

At the start of the period of FIG. 10, the signal OC is negated and therefore has the ground potential Vss. Thus, the transistors TN11 and TN12 of the sense amplifier circuit SACb are off. Therefore, the gate of the transistor TN1 is decoupled from the node N1, and the gate of the transistor TN2 is decoupled from the node N2.

At time t1, the signal OC is asserted, that is, the potential of the signal OC is set to the power supply potential Vddoc. The power supply potential Vddoc is an internal power supply potential, and, for example, has a magnitude different from that of the power supply potential Vdd. With the application of the power supply potential Vddoc, the transistors TN11 and TN12 are turned on, the transistor TN1 is diode-coupled, and the transistor TN2 is diode-coupled. Further, the node N1 is coupled to the selected bit line BL via the transistor TN11. Further, the node N2 is coupled to the selected complementary bit line ⁻BL via the transistor TN12. The potential of the signal OC is maintained until time t3.

The period from time t2 to time t3 is an offset cancellation period. Due to the isolation at time t2, the coupling between the node N1 and the selected complementary bit line ⁻BL via the transistor TN3 and the coupling between the node N2 and the selected bit line BL via the transistor TN4 are cut off. On the other hand, the nodes N1 and N2 are coupled to the selected bit line BL and the selected complementary bit line ⁻BL by the transistors TN11 and TN12, respectively, as described above. Therefore, the potentials of the nodes N1 and N2 are transferred to the selected bit line BL and the selected complementary bit line ⁻BL, respectively.

At time t2, the potential of the node SAP is set to the power supply potential Vddsa, and the potential of the node SAN is set to the ground potential Vss. As a result, the sense amplifier circuit SAC is set in a state where the potential can be amplified. Since the precharging ends and the isolation starts at time t2, the potentials of the selected bit line BL and the selected complementary bit line ⁻BL change from the precharge potential (Vddsa/2). During this change, offset cancellation is performed through the transistors TN11 and TN12 that are on. That is, the transistor TN1 is turned on by the transistor TN11, so that the on-resistance of the transistor TN1 is provided between the node N1 and the node SAN. Similarly, transistor TN2 is turned on by the transistor TN12, so that the on-resistance of the transistor TN2 is provided between the node N2 and the node SAN. Therefore, a potential based on the ratio of the on-resistance of the transistor TP1 to the on-resistance of the transistor TN1 is generated at the node N1, and a potential based on the ratio of the on-resistance of the transistor TP2 to the on-resistance of the transistor TN2 is generated at the node N2. In general, a p-type MOSFET and an n-type MOSFET have different on-resistances, and the on-resistance of the n-type MOSFET is lower than that of the p-type MOSFET. Therefore, each of the potential of the node N1 and the potential of the node N2 is not an intermediate value of the potential difference between the node SAP and the node SAN, and becomes lower than the intermediate value. The potentials of the node N1 and the node N2 change due to the offset cancellation, so that the potential of one of the selected bit line BL and the selected complementary bit line ⁻BL lowers from Vddsa/2 by a certain positive magnitude ΔV1, and the potential of the other line lowers from Vddsa/2 by a certain positive magnitude of ΔV2. The difference between ΔV1 and ΔV2 is generated because of variation between the on-resistance of the transistors TP1 and TP2 and the on-resistance of the transistors TN1 and TN2.

The difference between ΔV1 and ΔV2 is based on the difference (or, offset) between the on-resistance of the transistor TP1 and TP2 and the on-resistance of the transistor TN1 and TN2, as described above. Therefore, at the start of charge sharing, the nodes N1 and N2 have a potential difference based on the difference between the on-resistance Rp of the transistor TP1 and TP2 and the on-resistance Rn of the transistor TN1 and TN2. Thus, the selected bit line BL and the selected complementary bit line BL are charged so that they reflect the potentials of the nodes N1 and N2 having such a potential difference. Sensing is performed based on the potentials of the selected bit line BL and the selected complementary bit line BL thus charged. The potential difference between the nodes N1 and N2, which is generated due to the difference between the on-resistance RP of the transistors TP1 and TP2 and the on-resistance Rn of the transistors TN1 and TN2, leads to unequalness between the potential of the selected bit line BL and the selected complementary bit line ⁻BL. Against this phenomenon, the offset cancellation can equivalently cancel (or, compensate) the difference between the on-resistance Rp of the transistors TP1 and TP2 and the on-resistance Rn of the transistors TN1 and TN2. As a result, during the offset cancellation, the difference (or, margin) between the potential of the selected bit line BL and the reference potential in a case of the selected bit line BL having the higher potential and the difference between the potential of the selected bit line BL and the reference potential in a case of the selected bit line BL having the lower potential have an improved balance.

At time t3, the potential of the node SAP is set to a potential Vddsa/2, and the potential of the node SAN is set to the potential Vddsa/2. As a result, the sense amplifier circuit SAC cannot amplify a potential. Due to the charge sharing from time t3, in the "0" data storage case, the selected bit line EL comes to have a potential VB0$b$ of a certain magnitude. The potential of the selected complementary bit line ⁻BL is maintained. On the other hand, in the "1" data storage case, the potential of the selected bit line BL comes to have a potential VB1$b$ of a certain magnitude. The potential of the selected complementary bit line ⁻BL is maintained.

Reference symbols M0$b$ and M1$b$ in the figure will be described later.

2.3. Advantages

According to the second embodiment, the potential Vpl of the plate line PL has a magnitude based on the potentials which the selected bit line BL and the selected complementary bit line ⁻BL have after the end of precharging, and is set to a potential lower than the precharge potential Vpc, as in the first embodiment. Therefore, the same advantages as those of the first embodiment are attained.

In addition, according to the second embodiment, the application of the offset cancellation suppresses the imbalance between the "0" data storage case margin and the "1" data storage case margin, as described below.

Figure 11:
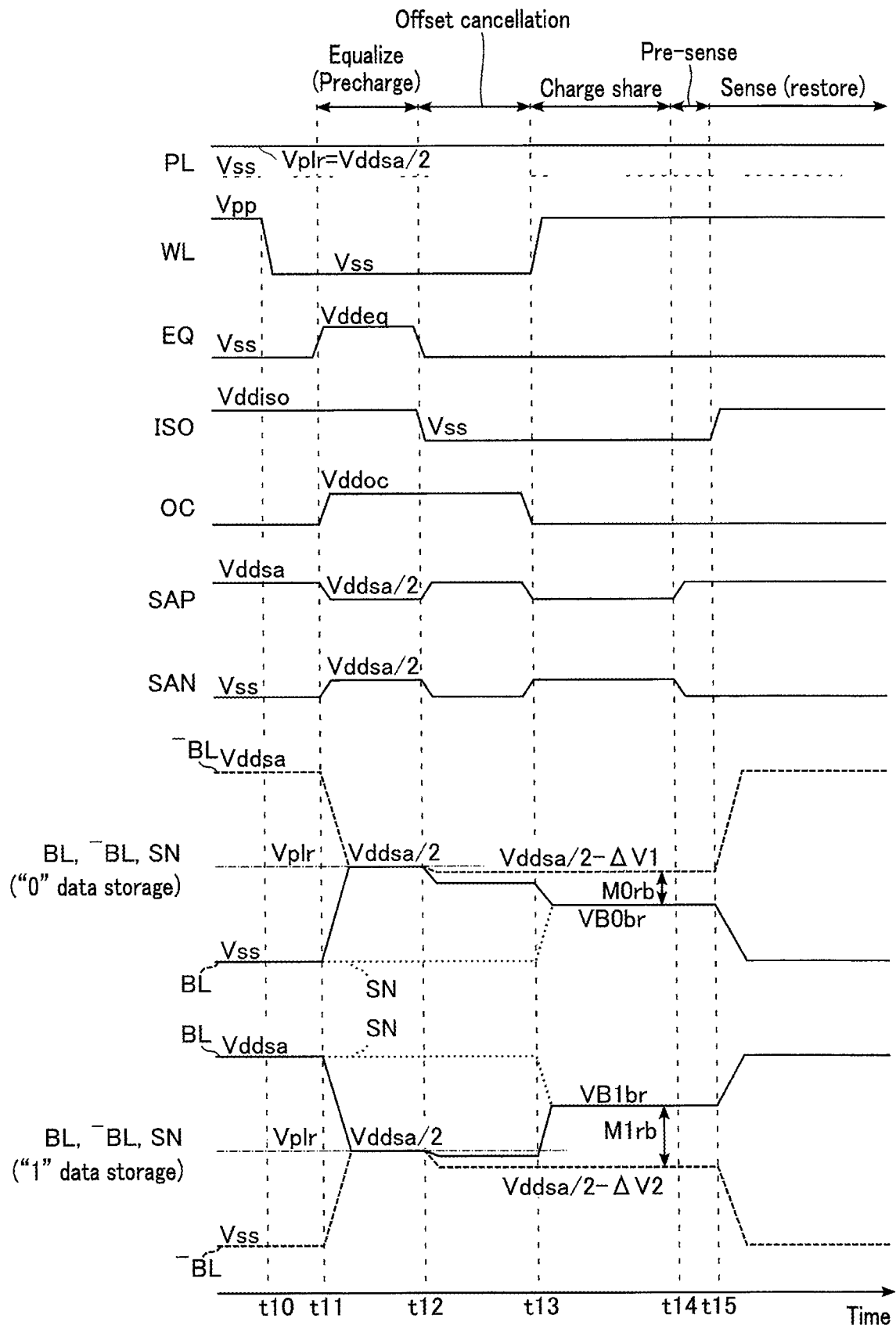
FIG. 11 shows how potentials of some components of a reference semiconductor memory device change with time.

FIG. 11 shows how potentials of some components of a reference semiconductor memory device 200 change with time.

In the reference semiconductor memory device 200, the potential Vpl of the plate line PL has a magnitude of Vddsa/2, as in the reference semiconductor memory device 100. Offset cancellation is started at time t12, and charge sharing is started at time t13. The offset cancellation lowers the potentials of the selected bit line BL and the selected complementary bit line ⁻BL. As a result, the potential which the selected bit line BL has after the charge sharing becomes lower than a potential of the selected bit line BL without the offset cancellation. In addition, in the "0" data storage case, rise of the potential of the storage node SN due to the leak current between the storage node SN and the plate line PL causes the potential of the selected bit line BL to have a higher potential than in a case without the leak current and have a potential VB0$br$ of a certain magnitude. In the "1" data storage case, fall of the potential of the storage node SN due to the leak current causes the potential of the selected bit line BL to have a lower potential than in a case without the leak current and have a potential VB1$br$ of a certain magnitude. Therefore, in the "0" data storage case, the lowered potential of the selected complementary bit line ⁻BL makes the "0" data storage case margin M0$rb$ small, whereas in the "1" data storage case, the lowered potential of the selected complementary bit line ⁻BL makes the "1" data storage case margin M1$rb$ large. As a result, a difference between the "0" data storage case margin M0$rb$ and "1" data storage case margin M1$rb$.

The "1" data storage case margin M1rb is smaller than the margin M1r of the case where offset cancellation is not performed (see FIG. 7), and the "0" data storage case margin M0rb is larger than the margin M0r of the case where the offset cancellation is not performed. That is, the imbalance between the "0" data storage case margin M0rb and the "1" data storage case margin M1rb, that is, the difference between the two margins, is smaller than that of the case shown in FIG. 7. However, the difference between the "0" data storage case margin M0rb and the "1" data storage case margin M1rb is still large.

According to the second embodiment, influence by the offset in the sense amplifier circuit SAC, that is, the difference between the on-resistance of the transistors TP1 and TP2 and the on-resistance of the transistors TN1 and Tn2, can be suppressed by the application of the offset cancellation.

According to the second embodiment, the potential generator 18b is provided, and the potential generator 18b maintains the potential Vplb of the plate line PL at a magnitude equal to the voltage obtained by dividing the potential difference Vddsa by the ratio of the on-resistances Rp and Rn. Due to the difference between the on-resistances Rp and Rn, the amounts ΔV1 and ΔV2 by which the potentials of the selected bit line BL and the selected complementary bit line ⁻BL decrease due to offset cancellation are also different. The potential of the storage node SN rises or falls toward the potential Vplb of the plate line PL due to the leak current. Based on this, the potential Vplb is set to have a magnitude between the potential of the post-precharge selected bit line BL and the potential of the post-recharge selected complementary bit line ⁻BL. Therefore, it is possible to suppress the imbalance of the difference between the "0" data storage case margin M0rb and the "1" data storage case margin M1rb, which results from the rise or fall of the potential of the storage node SN toward the potential Vpl of the plate line PL. That is, the imbalance of the difference between the "0" data storage case margin M0rb and the "1" data storage case margin M1rb can be suppressed through reflection of the difference between the on-resistances Rp and Rn.

2.4. Modification

FIG. 12 shows components of a potential generator of a modification of the second embodiment and also shows how the components are coupled. As shown in FIG. 12, a potential generator 18b2 of the modification includes a p-type MOSFET TP21 and n-type MOSFETs TN21 and TN22, in place of the resistors R1 and R2 of the potential generator 18b, respectively.

The transistor TP21 has substantially the same on-resistance Rp as the transistor TP1 (and/or TP2). To this end, by way of example, the transistor TP21 can have substantially the same gate length and gate width as the gate length and gate width of the transistor TP1, and can have substantially the same impurity concentration in a channel region as the impurity concentration in a channel region of the transistor TP1.

The transistor TP21 is coupled between a node of the power supply potential Vddsa and the node N11. The transistor TP21 is coupled to the node N11 at the gate and is diode-coupled.

The transistor TN21 has substantially the same on-resistance Rn as the transistor TN1 (and/or TN2). To this end, by way of example, the transistor TN21 can have substantially the same gate length and gate width as the gate length and gate width of the transistor TN1, and can have substantially the same impurity concentration in a channel region as the impurity concentration in a channel region of the transistor TN1. The transistor TN21 is coupled between the node N11 and the node of the ground potential Vss.

The transistor TN22 is coupled between the node N11 and the gate of the transistor TN21. The transistor TN22 receives the signal OC at the gate. The transistor TN22 is turned on while the signal OC is asserted, and the transistor TN21 is diode-coupled.

According to the modification, during the offset cancellation, the potential of the node N11 has a magnitude based on the on-resistance of the transistor TP21 and the on-resistance of the transistor TN21, and the on-resistance of the transistor TP21 and the on-resistance of the transistor TN21 are substantially the same as the on-resistance Rp of the transistor TP1 and the on-resistance Rn of the transistor TN1, respectively. Therefore, during the offset cancellation, the potential Vplb of the plate line PL is maintained at substantially the same magnitude as the potential of the bit line BL. The accuracy of this maintenance is high because the on-resistances of the transistors TP21 and TN21, which determine the potential of the node N11, are substantially the same as the on-resistances Rp and Rn of the transistors TP1 and TN1, which determine the potential of the bit line BL.

3. Third Embodiment

The third embodiment is based on the first and second embodiments and differs from the first and second embodiments in terms of a potential generator 18 used. In the description below, the features different from those of the first and second embodiments will be mainly described.

The potential generator 18 of the third embodiment differs from the potential generators 18 of other embodiments. In the description below, the potential generator 18 of the third embodiment may be referred to as a potential generator 18c in order to distinguish it from the potential generators 18 of other embodiments.

The third embodiment can be applied to each of the first embodiment and the second embodiment. The third embodiment may also be applied to the modification of the second embodiment.

FIG. 13 shows components of the potential generator of the third embodiment and related components, and illustrates how the components are coupled. As shown in FIG. 13, the potential generator 18c includes an n-type MOSFET TN31 in addition to the configuration of the potential generator 18 of the first embodiment and the configuration of the potential generator 18b of the second embodiment. FIG. 13 shows a third embodiment configured based on the second embodiment. A transistor TN31 is coupled between the plate line. PL and a bit line BL. The transistor TN31 receives a signal BLEQ at the gate. The signal BLEQ is supplied from a component provided in a read circuit 17. The signal BLEQ has, for example, the same logic level as the signal OC. Therefore, during offset cancellation, the plate line PL and the selected bit line BL are coupled by a turned-on transistor TN31.

According to the third embodiment, the potential Vpl of the plate line PL has a magnitude based on the potentials which the selected bit line BL and the selected complementary bit line ⁻BL have after the end of precharging, and is lower than the precharge potential Vpc, as in the first embodiment. Therefore, the same advantages as those of the first embodiment are attained.

Further, according to the third embodiment, the potential generator 18c includes a transistor TN31 between the plate line PL and the bit line BL, and the transistor TN31 is turned on during the offset cancellation. Therefore, the plate line PL and the bit line BL are coupled during the offset cancellation. Thus, the function of making the potential Vpl of the plate line PL substantially the same as the potential of the bit line BL is more accurate in the third embodiment than in the first and second embodiments. Therefore, the imbalance between the "0" data storage case margin M0 and the "1" data storage case margin M1 can be suppressed with higher accuracy in the third embodiment than in the first and second embodiments.

Further, when the third embodiment is based on the second embodiment, a configuration for offset cancellation is provided as in the second embodiment. Therefore, the same advantages as those of the second embodiment are attained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell including:
a capacitor including a first end and a second end; and
a first transistor including a third end and a fourth end, being coupled to the first end at the fourth end, and containing an oxide semiconductor;
a bit line coupled to the third end;
a sense amplifier coupled to the bit line and coupled between a first node of a first potential and a second node of a second potential lower than the first potential; and
a potential generator configured to supply the second end with a fourth potential that is different from a third potential intermediate between the first potential and the second potential, wherein
the fourth potential is lower than the third potential,
the sense amplifier is further configured to set the bit line to the third potential during data read to the memory cell,
a potential of the bit line falls from the third potential while the first transistor is off during the data read, and
the fourth potential is based on an amount by which the potential of the bit line falls from the third potential.

2. The device of claim 1, further comprising:
a tenth transistor between the second end and the bit line.

3. A semiconductor memory device comprising:
a memory cell including:
a capacitor including a first end and a second end; and
a first transistor including a third end and a fourth end, being coupled to the first end at the fourth end, and containing an oxide semiconductor;
a bit line coupled to the third end;
a sense amplifier coupled to the bit line and coupled between a first node of a first potential and a second node of a second potential lower than the first potential; and a potential generator configured to supply the second end with a fourth potential that is different from a third potential intermediate between the first potential and the second potential, wherein
the fourth potential is lower than the third potential,
the sense amplifier is further configured to set the bit line to the third potential during data read to the memory cell, and
a potential of the bit line falls from the third potential to the fourth potential while the first transistor is off during the data read.

4. The device of claim 1, further comprising:
a tenth transistor between the second end and the bit line.

5. A semiconductor memory device comprising:
a memory cell including:
a capacitor including a first end and a second end; and
a first transistor including a third end and a fourth end, being coupled to the first end at the fourth end, and containing an oxide semiconductor;
a bit line coupled to the third end;
a sense amplifier coupled to the bit line and coupled between a first node of a first potential and a second node of a second potential lower than the first potential; and
a potential generator configured to supply the second end with a fourth potential that is different from a third potential intermediate between the first potential and the second potential, wherein
the sense amplifier includes:
a second transistor of a first conductivity type including a fifth end and a sixth end, the fifth end being coupled to the first node, and the sixth end being coupled to a third node;
a third transistor of a second conductivity type including a seventh end and an eighth end, the seventh end being coupled to the third node, and the eighth end being coupled to the second node;
a fourth transistor including a ninth end and a tenth end, the ninth end being coupled to the third node, and the tenth end being coupled to a gate of the third transistor;
a fifth transistor of the first conductivity type including an eleventh end and a twelfth end, the eleventh end being coupled to the first node, the twelfth end being coupled to a fourth node, the fourth node being coupled to a gate of the second transistor, and a gate of the fifth transistor being coupled to the third node;
a sixth transistor of the second conductivity type including a thirteenth end and a fourteenth end, the thirteenth end being coupled to the fourth node, and the fourteenth end being coupled to the second node; and
a seventh transistor including a fifteenth end and a sixteenth end, the fifteenth end being coupled to the fourth node, and the sixteenth end being coupled to a gate of the sixth transistor.

6. The device of claim 5, further comprising:
a tenth transistor between the second end and the bit line.

7. The device of claim 5, further comprising:
an eighth transistor including a seventeenth end and an eighteenth end, the seventeenth end being coupled to the fourth node, and the eighteenth end being coupled to the bit line and the gate of the third transistor; and
a ninth transistor including a nineteenth end and a twentieth end, the nineteenth end being coupled to the third node, and the twentieth end being coupled to a gate of the sixth transistor.

8. A semiconductor memory device comprising:
a memory cell including:

a capacitor including a first end and a second end; and a first transistor including a third end and a fourth end, being coupled to the first end at the fourth end, and containing an oxide semiconductor;

a bit line coupled to the third end;

a sense amplifier coupled to the bit line and coupled between a first node of a first potential and a second node of a second potential lower than the first potential; and a potential generator configured to supply the second end with a fourth potential that is different from a third potential intermediate between the first potential and the second potential, wherein the sense amplifier includes:

a second transistor of a first conductivity type between the first node and a third node;

a third transistor of a second conductivity type between the third node and the second node;

a fourth transistor between the third node and a gate of the third transistor;

a fifth transistor of the first conductivity type between the first node and a fourth node;

a sixth transistor of the second conductivity type between the fourth node and the second node;

a seventh transistor between the fourth node and a gate of the sixth transistor, the second transistor has a first on-resistance, the third transistor has a second on-resistance, the first potential and the second potential have a first potential difference, and the fourth potential is based on a product of the first potential difference and a ratio of the second on-resistance to a sum of the first on-resistance and the second on-resistance.

9. The device of claim 8, further comprising:
a tenth transistor between the second end and the bit line.

10. A semiconductor memory device comprising:
a memory cell including:
   a capacitor including a first end and a second end; and
   a first transistor including a third end and a fourth end, being coupled to the first end at the fourth end, and containing an oxide semiconductor;
a bit line coupled to the third end;
a sense amplifier coupled to the bit line and coupled between a first node of a first potential and a second node of a second potential lower than the first potential; and
a potential generator configured to supply the second end with a fourth potential that is different from a third potential intermediate between the first potential and the second potential, wherein
the sense amplifier includes:
a second transistor of a first conductivity type between the first node and a third node;
a third transistor of a second conductivity type between the third node and the second node;
a fourth transistor between the third node and a gate of the third transistor;
a fifth transistor of the first conductivity type between the first node and a fourth node;
a sixth transistor of the second conductivity type between the fourth node and the second node;
a seventh transistor between the fourth node and a gate of the sixth transistor,
the second transistor has a first on-resistance,
the third transistor has a second on-resistance, and
the potential generator includes:
a first resistor whose resistance is substantially equal to the first on-resistance;
a second resistor including a fifth end coupled to the first resistor and having resistance substantially equal to the second on-resistance; and
an operational amplifier circuit including a non-inverting input terminal coupled to the fifth end, an inverting input terminal coupled to the second end, and an output terminal.

11. The device of claim 10, wherein
the first resistor includes an eighth transistor of the first conductivity type, and
the second resistor includes a ninth transistor of the second conductivity type.

12. The device of claim 11, further comprising:
a tenth transistor between the second end and the bit line.

13. The device of claim 10, further comprising:
a tenth transistor between the second end and the bit line.

* * * * *